United States Patent
Heiss et al.

(10) Patent No.: US 10,527,668 B2
(45) Date of Patent: Jan. 7, 2020

(54) APPARATUS AND A METHOD FOR PREDICTING A FUTURE STATE OF AN ELECTRONIC COMPONENT

(71) Applicant: Intel IP Corporation, Santa Clara, CA (US)

(72) Inventors: Leonhard Heiss, Warngau (DE); Andreas Lachmann, Unterhaching (DE); Reiner Schwab, Hausham (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/751,208

(22) PCT Filed: Jun. 21, 2016

(86) PCT No.: PCT/IB2016/053665
§ 371 (c)(1),
(2) Date: Feb. 8, 2018

(87) PCT Pub. No.: WO2017/051264
PCT Pub. Date: Mar. 30, 2017

(65) Prior Publication Data
US 2018/0231601 A1  Aug. 16, 2018

(30) Foreign Application Priority Data
Sep. 23, 2015 (DE) .......... 10 2015 116 094

(51) Int. Cl.
*G01R 31/26* (2014.01)
*G01R 31/27* (2006.01)

(52) U.S. Cl.
CPC ....... *G01R 31/2642* (2013.01); *G01R 31/275* (2013.01)

(58) Field of Classification Search
CPC .................... G01R 31/2642; G01R 31/275
See application file for complete search history.

(56) References Cited

U.S. PATENT DOCUMENTS 6,731,179 B2  5/2004  Abadeer et al.
7,111,179 B1  9/2006  Girson et al.
(Continued)

FOREIGN PATENT DOCUMENTS

| EP | 1398639 A2 | 3/2004 |
|---|---|---|
| JP | 2004170361 A | 6/2004 |
| WO | 2004030022 A2 | 4/2004 |
| WO | 2010057364 A1 | 5/2010 |
| WO | 2014074518 A1 | 5/2014 |

OTHER PUBLICATIONS

Agarwal et al.: "Circuit Failure Prediction and Its Application to Transistor Aging", 25th IEEE VLSI Text Symmposium.
(Continued)

*Primary Examiner* — Thomas J. Hiltunen
(74) *Attorney, Agent, or Firm* — 2SPL Patent Attorneys PartG mbB

(57) ABSTRACT

An apparatus for predicting a future state of an electronic component is provided. The apparatus includes a measuring unit configured to measure a waveform of a signal related to the electronic component. Further, the apparatus includes a processing unit configured to calculate a predicted value of a characteristic of the electronic component based on a reliability model of the electronic component using the waveform of the signal.

18 Claims, 5 Drawing Sheets

(56) References Cited

U.S. PATENT DOCUMENTS

| | | | |
|---|---|---|---|
| 7,940,034 B2* | 5/2011 | Pelz | H03K 17/0822 |
| | | | 323/283 |
| 8,248,095 B2 | 8/2012 | Noorlag et al. | |
| 8,629,667 B2 | 1/2014 | Paillet et al. | |
| 8,901,899 B1* | 12/2014 | Kiadeh | H02M 3/156 |
| | | | 323/271 |
| 9,473,013 B2* | 10/2016 | Singh Riar | H02M 7/487 |
| 9,780,636 B2* | 10/2017 | Deboy | H02M 1/083 |
| 9,780,639 B2* | 10/2017 | Deboy | H02M 1/32 |
| 10,033,283 B2* | 7/2018 | Gong | H02M 3/33507 |
| 10,230,239 B2* | 3/2019 | Feng | G05F 1/70 |
| 2009/0256640 A1 | 10/2009 | Reilly et al. | |
| 2011/0181315 A1 | 7/2011 | Krishnan | |
| 2012/0206183 A1 | 8/2012 | Priel et al. | |
| 2016/0377671 A1* | 12/2016 | Sjoroos | G01R 31/2608 |
| | | | 324/762.01 |
| 2018/0188316 A1* | 7/2018 | Chen | G01R 31/2642 |
| 2018/0358897 A1* | 12/2018 | Thoma | H02M 3/07 |

OTHER PUBLICATIONS

Aryan et al.: "Reliability Monitoring of Digital Circuits by in situ Timing Measurement", 2013 IEEE.

Bowman et at: "Energy-Efficient and Metastability-Immune Resilient Circuits for Dynamic Veriation Tolerance", 2008 IEEE.

Chen et al: "Aging Sensors for Workload Centric Guardbanding in Dynamic Voltage Scaling Applications", 2013 IEEE.

Chun et al.: "Design of Online Aging Sensor Architecture for Mixed-Signal Intergrated Circuits", 2013 IEEE.

Huard et at: "Adaptive wearout management with in-situ aging monitors", 2014 IEEE.

Iizuka et al.: "Buffer-Ring-Based All-Digital on-Chip monitor for PMOSandNMOSProcess Variability and Aging Effects", 2010 IEEE.

Jayaraman et al.: "Design an Analysis of 1-60GHz, RF CMOS Peak Detectors for LNA Calibration", 2009 IEEE.

Kim et at: "On-Chip Aging Sensor Circuits for Reliable Nanometers MOSFET Digital Circuits", 2010 IEEE.

Kruiskamp et al.: "A CMOS Peak Detect Sample and Hold Circuit", 1994 IEEE.

Sleiman et al..: " A CMOS Aplitude Detecvtor for RF-BIST and Calibration", 2009 IEEE.

Tschanz et at.: "Adaptive Frequency and Biasing Techniques for Tolerance to Dynamic Temperature-Voltage Variations and Aging ", 2007 IEEE.

Wirnshofer et al.: "A Variation-Aware Adaptive Voltage Scaling Technique based on In-Situ Delay Monitoring", 2011 IEEE.

* cited by examiner

APPARATUS AND A METHOD FOR PREDICTING A FUTURE STATE OF AN ELECTRONIC COMPONENT

FIELD

Examples relate to reliability monitoring of electronic components and circuits. In particular, some examples relate to an apparatus and a method for predicting a future state of an electronic component. Further examples relate to apparatuses and methods for predicting a future state of a semiconductor circuit.

BACKGROUND

For achieving optimum performance, a supply voltage for an electronic component (e.g. a semiconductor component) or an electronic circuit (e.g. a semiconductor circuit) may exceed a nominal supply voltage level. A supply voltage higher than the nominal supply voltage may lead to a reduced life-time of the electronic component or circuit, i.e., a reliability of the electronic component or circuit may be reduced. For example, for a transistor, exceeding the nominal supply voltage level may cause a variety of degradation processes and lead to transistor wear. The transistor may, e.g., be subject to hot carrier degradation (HCD) due to hot carrier injection in the transistor's semiconductor material, bias temperature instability (BTI), or time dependent dielectric breakdown (TDDB).

For monitoring the reliability of an electronic circuit, replica circuits which mimic the aging behavior of the electronic circuit may be used. However, replica circuits are imprecise since actual stress conditions in the electronic circuit are not taken into account. Accordingly, overestimation or underestimation of the actual circuit degradation occurs. For digital circuits, timing based monitors which measure the degradation induced increase in path delays of the digital circuit may be used. However, this approach may only be used for digital circuits, not for analog circuitry. Moreover, both concepts only measure the impact of degradation on the monitored circuit—no prediction on the future degradation of the circuit is possible. Accordingly, no preventive measures for avoiding circuit failure or extending the lifetime of the circuit may be taken. Hence, there may be a desire for improved reliability monitoring of electronic components and circuits.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
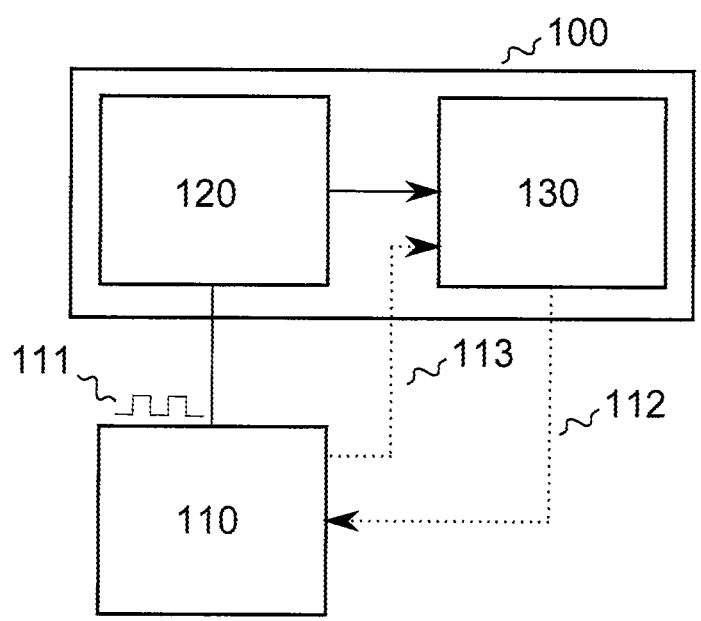
FIG. 1 illustrates an example of an apparatus for predicting a future state of an electronic component.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some examples thereof are shown by way of example in the figures and will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular examples only and is not intended to be limiting of further examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art, unless expressly defined otherwise herein.

In the following, various examples relate to devices (e.g. cell phone, base station) or components (e.g. transmitter, transceiver) of devices used in wireless or mobile communications systems. A mobile communication system may, for example, correspond to one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (EUTRAN), Long Term Evolution (LTE) or LTE-Advanced (LTE-A), or mobile communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. The terms mobile communication system and mobile communication network may be used synonymously.

The mobile communication system may comprise a plurality of transmission points or base station transceivers operable to communicate radio signals with a mobile transceiver. In some examples, the mobile communication system may comprise mobile transceivers, relay station transceivers and base station transceivers. The relay station transceivers and base station transceivers can be composed of one or more central units and one or more remote units.

A mobile transceiver or mobile device may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile transceiver or terminal may also be referred to as UE or user in line with the 3GPP terminology. A base station transceiver can be located in the fixed or stationary part of the network or system. A base station transceiver may correspond to a remote radio head, a transmission point, an access point, a macro cell, a small cell, a micro cell, a pico cell, a femto cell, a metro cell etc. The term small cell may refer to any cell smaller than a macro cell, i.e. a micro cell, a pico cell, a femto cell, or a metro cell. Moreover, a femto cell is considered smaller than a pico cell, which is considered smaller than a micro cell. A base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

The mobile communication system may be cellular. The term cell refers to a coverage area of radio services provided by a transmission point, a remote unit, a remote head, a remote radio head, a base station transceiver, relay transceiver or a NodeB, an eNodeB, respectively. The terms cell and base station transceiver may be used synonymously. In some examples a cell may correspond to a sector. For example, sectors can be achieved using sector antennas, which provide a characteristic for covering an angular section around a base station transceiver or remote unit. In some examples, a base station transceiver or remote unit may, for example, operate three or six cells covering sectors of 120° (in case of three cells), 60° (in case of six cells) respectively. Likewise a relay transceiver may establish one or more cells in its coverage area. A mobile transceiver can be registered or associated with at least one cell, i.e. it can be associated to a cell such that data can be exchanged between the network and the mobile in the coverage area of the associated cell using a dedicated channel, link or connection. A mobile transceiver may hence register or be associated with a relay station or base station transceiver directly or indirectly, where an indirect registration or association may be through one or more relay transceivers.

FIG. 1 illustrates an apparatus 100 for predicting a future state of an electronic component 110. The electronic component may in general be any component that receives, processes or outputs electric signals. For example, the electronic component may be a capacitor, a diode, a resistor, or an interconnect (e.g. made of metal). In some examples, the electronic component 110 may be a transistor (e.g. a field-effect transistor or a bipolar transistor).

The apparatus 100 comprises a measuring unit 120 for measuring a waveform of a signal 111 related to the electronic component 110. For example, the signal 111 may be an input signal for the electronic component 110, an output signal of the electronic component 110, a signal (e.g. a current or a voltage signal) at a terminal of the electronic component 110, or a signal (e.g. a current or a voltage signal) between terminals of the electronic component 110. For example, for the electronic component 110 being a field effect transistor, the signal 111 may represent a voltage at a gate of the transistor, a voltage between a drain and a source of the transistor, a voltage between the drain and the gate of transistor, or a voltage between the gate and the source of the transistor. For example, for the electronic component 110 being a bipolar transistor, the signal 111 may represent a current at a basis of the transistor, a voltage between an emitter and a collector of the transistor, a voltage between the basis and the emitter of the transistor, or a voltage between the basis and the collector of the transistor.

The measuring unit 120 may be any measuring device that is capable of measuring the waveform of the signal 111. The waveform of the signal 111 is the temporal course of the signal 111. In some examples, the measuring unit 120 may thus sample the signal 111 in order to provide samples of the signal 111 (e.g. the samples may be provided as digital samples). Moreover, the measuring unit 120 may in some examples detect at least one of an instantaneous edge steepness, a change of the edge steepness or an amplitude of the signal 111. In some examples, the measuring unit 120 may be configured to classify a waveform of the signal 111. For example, the measuring unit 120 may classify whether the waveform of the signal 111 is similar to a sine wave, or a square wave. The waveform of the signal 111 may allow to precisely consider an instantaneous state of the electronic component 110 within a reliability model of the electronic component 110. For example, a square waveform of the signal 111 may indicate a more advanced degradation of the electronic component 110 than a sine waveform of the signal 111. In some examples, the measuring unit 120 may have the functionality of an oscilloscope. For example, the measuring unit 120 may be provided as an on-chip oscilloscope on a semiconductor substrate holding the electronic component 110 (i.e. the measuring unit 120 and the electronic component 110 may be provided on a same semiconductor substrate).

The measured waveform of the signal 111 is used by a processing unit 130 of the apparatus 100 to calculate a predicted value of a characteristic of the electronic component 110 based on a reliability model of the electronic component 110. That is, the processing unit calculates an expected future value of the characteristic of the electronic component 110. The reliability (physical) model of the electronic component 110 models a future reliability of the electronic component. The reliability model may, e.g., take into account a physical degradation, an aging behavior or a noise evolution (behavior) of the electronic component 110. For example, the reliability model may be based on fundamental physical processes within the electronic component 110. In some examples, the reliability model may be an analytical model. The characteristic of the electronic component 110 is a quantity that allows to characterize the electronic component 110. For example, for the electronic component 110 being a CMOS transistor, the characteristic may be a threshold voltage of the transistor, a drain saturation current of the transistor, a transconductance of the transistor, a gate leakage current of the transistor, or a bulk current of the transistor. For the electronic component 110 being a bipolar transistor, the characteristic may, e.g., be a current gain, a transconductance, a differential input resistance, a differential output resistance or a maximum collector current.

The predicted characteristic of the electronic component 110 may allow to characterize the electronic component at a future time instant. The predicted value of the characteristic of the electronic component 110 may be a predicted absolute value of the characteristic, or a predicted divergence (deviation, drift) of the value of the characteristic. The predicted characteristic of the electronic component 110 may thus indicate a future state of the electronic component 110. Using the waveform of the signal 111 (and the contained information on the instantaneous state of the electronic component 110) for the reliability model may allow to predict the characteristic of the electronic component 110 with high accuracy. The future state may, e.g., allow to predict a remaining life-time of the electronic component or may indicate an imminent failure of the electronic component 110. Accordingly, the apparatus may allow to initiate preventive measures based on the predicted future state of the electronic component. For example, if the predicted future state indicates an imminent failure, the electronic component 110 may be replaced or the tasks of the electronic component may be delegated to another electronic component of an electronic device comprising the electronic component 110.

In some examples, the processing unit 130 further compares the predicted value of the characteristic of the electronic component 110 to a quality criterion. The quality criterion may, e.g., be a value or value range for the characteristic of the electronic component 110 expected by the manufacturer. That is, the predicted value may be compared to a desired or nominal value of the characteristic. Based on the result of the comparison, the processing unit 130 may further adjust an operation parameter 112 of the electronic component 110. In some examples, the processing unit 130 may adjust a supply voltage for the electronic component 110 based on the result of the comparison. For example, if the predicted value of the signal characteristic is different from a desired value or value range of the signal characteristic, the processing unit 130 may increase or lower the supply voltage for the electronic component 110. For example, if the signal characteristic indicates that the life-time is lower than a desired (nominal) life-time, lowering the supply voltage for the electronic component 110 may allow to extend the actual life-time of the electronic component 110 since a lower supply voltage causes a smaller amount of degradation of the electronic component (e.g. less HCD or TDDB for a transistor). Moreover, if the signal characteristic indicates that the life-time is above the nominal life-time, increasing the supply voltage for the electronic component 110 may allow to increase a power (performance) of the electronic component 110 for the trade-off that the actual life-time of the electronic component 110 decreases to the nominal life-time. Hence, a user may experience an increased performance of an electronic device using the electronic component 110.

In addition to the waveform of the signal 111, the reliability model may in some examples comprise further input parameters (e.g. a temperature 113 of the electronic component 110). That is, the predicted value of the characteristic of the electronic component may in some examples be based on multiple input parameters. Using multiple input parameters for calculating the predicted value of the characteristic of the electronic component 110 may allow to increase the accuracy of the prediction (forecast) of the future state of the electronic component 110. The temperature 113 of the electronic component 110 is known as one major factor on which degradation of the electronic component 110 depends. Accordingly, measuring the temperature 113 and calculating the predicted value of the signal characteristic of the electronic component 110 based on the temperature 113 may allow to more precisely predict the impact of the temperature 113 on the degradation of the electronic component 110. Hence, the future state of the electronic component 110 may be predicted more precisely.

In some examples, the measuring unit 120 further measures an instantaneous value of the characteristic of the electronic component 110 at a time instant. The processing unit 130 compares the instantaneous value of the characteristic of the electronic component 110 to the predicted value of the characteristic of the electronic component 110 calculated for the time instant. By comparing the real instantaneous value of the characteristic of the electronic component 110 to the predicted value of the characteristic of the electronic component 110, verification of the predicted value of the characteristic of the electronic component 110 may be possible. By comparing both values, overestimation or underestimation of the characteristic of the electronic component 110 by the reliability model may be detected. The instantaneous value of the characteristic may alternatively or additionally be compared to the quality criterion. By the comparison, an instantaneous state of the electronic component 110 may be determined. Accordingly, countermeasures may be initiated based on the comparison result.

The processing unit 130 may thus further adjust the operation of the electronic component 110 based on the comparison between the instantaneous value of characteristic of the electronic component 110 and the predicted value of the characteristic of the electronic component 110 calculated for the time instant and/or the quality criterion. For example, the supply voltage for the electronic component 110 may be adjusted based on the comparison. Accordingly, it may be assured that the operation of the electronic component 110 does not fully rely on the prediction of the reliability model.

Additionally or alternatively, the processing unit 130 may further adjust the reliability model based on the comparison between the instantaneous value of characteristic of the electronic component 110 and the predicted value of the characteristic of the electronic component 110 calculated for the time instant and/or the quality criterion. For example, the processing unit 130 may adjust coefficients of mathematical equations comprised by the reliability model, or enable or disable one or more correction terms for mathematical equations of the reliability model. Adjusting the reliability model based on the comparison may allow to adapt the reliability model to the actual behavior of electronic component 110. Overestimation or underestimation characteristic of the electronic component 110 by the reliability model may thus be reduced or even completely avoided. Hence, a precision of the predicted values of the characteristic of the electronic component 110 may be increased.

In some examples, the signal 111 may be transient signal, i.e., a short-lived signal that may have a high amplitude (i.e. high energy). Transient signals present at terminals of electronic components are known as one major factor driving degradation of electronic components. Accordingly, measuring the transient signal and calculating the predicted value of the signal characteristic of the electronic component 110 based on the waveform of the transient signal may allow to more precisely predict the impact of the transient signal on the degradation of the electronic component 110. Hence, the future state of the electronic component 110 may be predicted more precisely.

The measuring unit 120 and the processing unit 130 (i.e. the apparatus 100) may in some examples only operate in response to a trigger event. Accordingly, a power consumption of the apparatus 100 may be minimized since the apparatus 100 is only active in response to the trigger event. Additionally, efficient prediction of future states of the electronic component 110 may be assured since the apparatus is active in response to the trigger event. For example, the trigger event may be an occurrence of a pre-determined time instant, or an event where a voltage value of the signal 111 is above a threshold value. The voltage value of the signal 111 being above the threshold value may, e.g., indicate a harming transient signal, so that the apparatus 100 may detect the transient signal and predict the future state in consideration of the transient signal.

The apparatus 100 may comprise one or more additional optional features corresponding to one or more aspects of the proposed concept or one or more examples described below.

Generally speaking, some examples relate to a means for predicting a future state of an electronic component. The means comprises a means for measuring a waveform of a signal related to the electronic component, and a means for calculating a predicted value of a characteristic of the electronic component based on a reliability model of the electronic component using the waveform of the signal. The means for calculating may further be configured to compare the predicted value of the characteristic of the electronic component to a quality criterion, and to adjust an operation parameter of the electronic component based on the result of the comparison.

The means for predicting a future state of an electronic component may be implemented by an apparatus for predicting a future state of an electronic component described above or below (e.g. FIG. 1). The means for measuring a future state of an electronic component may be implemented by a measuring unit described above or below (e.g. FIG. 1). The means for calculating may be implemented by a processing unit described above or below (e.g. FIG. 1).

Figure 2:
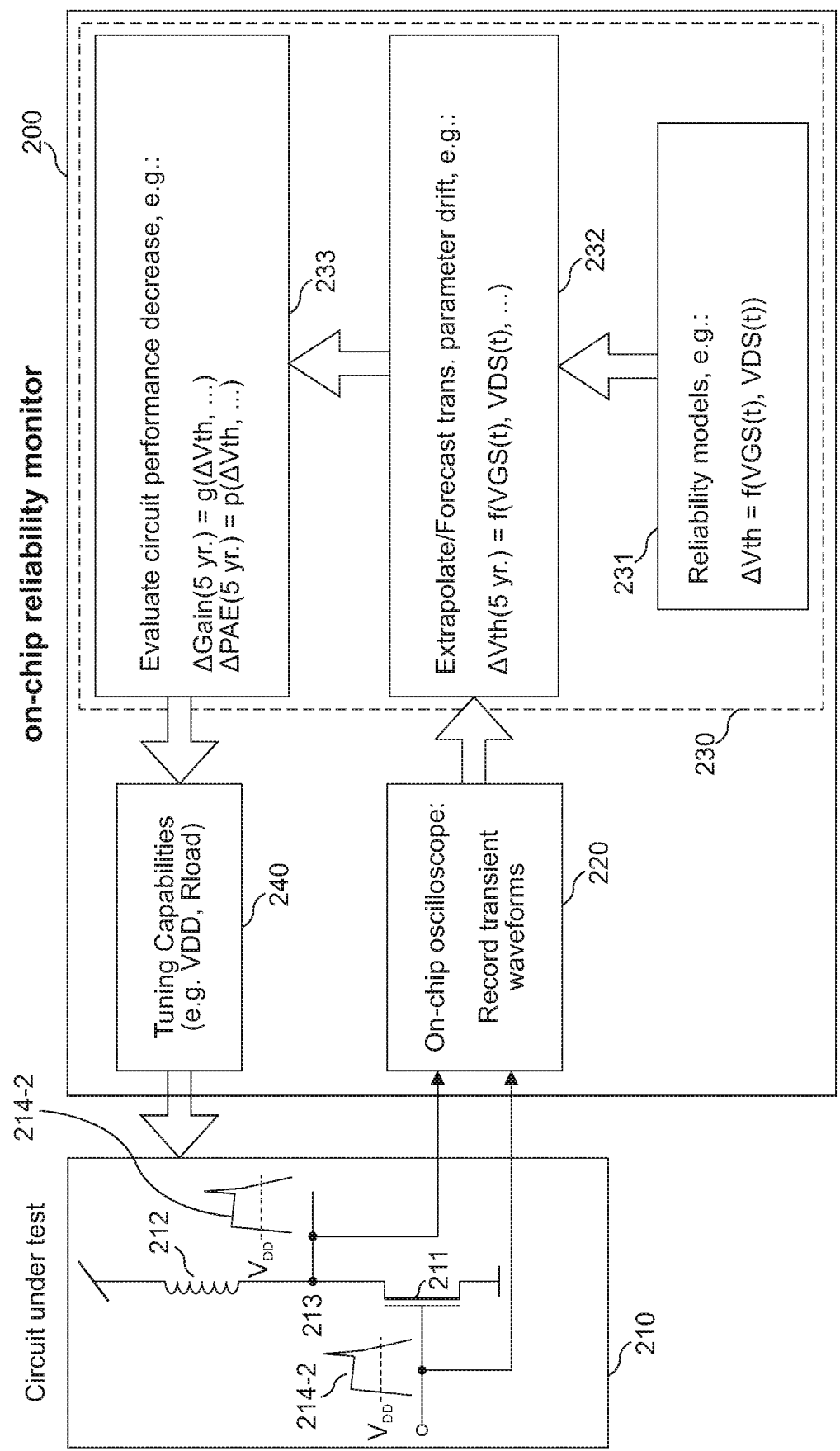
FIG. 2 illustrates an example of an apparatus for predicting a future state of a semiconductor circuit.

In FIG. 2, an apparatus 200 for predicting a future state of a semiconductor circuit 210 is illustrated. The semiconductor circuit 210 comprises inter alia a transistor 211 and a coil 212, which is connected to a drain of the transistor 211 via a first node 213.

The apparatus 200 comprises a measuring unit 220 (e.g. an on-chip oscilloscope on the semiconductor substrate holding the semiconductor circuit 210) for measuring a waveform of at least one signal at a node of the semiconductor circuit 210. The signal is related to an electronic component (e.g. the transistor 211) of the semiconductor circuit 210. As illustrated in FIG. 2, the measuring unit 220 may measure waveforms of multiple signals at multiple nodes of the semiconductor circuit 210. For example, a waveform of a first signal 214-1 at a gate of the transistor 211, and a waveform of a second signal 214-2 at the node 213 between the coil 212 and the drain of the transistor 211 may be measured. Both, the first signal 214-1 and the second signal 214-2 are related to the transistor 211 (as an example for an electronic component of the semiconductor circuit 210). However, various other signals within the semiconductor circuit 210 may be used (e.g. a signal representing a voltage between a drain and a source of the transistor 211, or a voltage between the gate and the source of the transistor 211). Moreover, signals related to other reliability critical electronic components of the semiconductor circuit 210 may be measured (e.g. of a diode, a resistor, etc.). The first signal 214-1 and the second signal 214-2 are for illustrative purposes illustrated as transient signals, i.e., the first and the second signal 214-1, 214-2 are short-lived and have a high signal amplitude (e.g. a voltage amplitude above a nominal supply voltage $V_{DD}$ for the semiconductor circuit 210). The waveform of the transient signal may have a sharp peak as indicated by the first and the second signal 214-1, 214-2.

The measured waveform of the at least one signal is used by a processing unit 230 of the apparatus 200 for calculating a predicted value 232 of a characteristic of the electronic component (e.g. transistor 211) of the semiconductor circuit 210. The processing unit 230 calculates the predicted value 232 for the characteristic based on a reliability model 231 of the electronic component. For example, the reliability model 231 may comprise a model for predicting a future value of the threshold voltage $V_{th}$ of a transistor, a saturation current of a drain of a transistor, or a transconductance of a transistor. For example, the predicted value 232 of the transistor's threshold voltage may depend on the waveform of at least one signal representing a voltage at the gate of the transistor, at a drain of the transistor, at a source of the transistor, a voltage between the drain and the source of the transistor and/or a voltage between the gate and the source of the transistor. In general, the reliability model may comprise a plurality of input parameters (e.g. also a temperature of the electronic component or the semiconductor circuit 210).

The predicted value 232 of the characteristic may be an absolute value of the characteristic or a divergence of the value of the characteristic as indicated in FIG. 2. That is, the predicted value may characterize a future state or a degradation of the electronic component of the semiconductor circuit 210. For example, a predicted absolute value for the threshold voltage of transistor 211, or a predicted divergence of the value of the threshold voltage of transistor 211 may allow to characterize a future state or a degradation of the transistor 211.

The processing unit 230 uses the predicted value 232 of the characteristic of the electronic component in order to calculate a predicted value 233 of a characteristic of the semiconductor circuit 210. The predicted value 233 may allow to characterize a state or degradation of the semiconductor circuit 210. In some examples, the predicted value 233 of the characteristic of the semiconductor circuit 210 may be an absolute value. In some example, the predicted value 233 of the characteristic of the semiconductor circuit 210 may be a predicted divergence of the value of the characteristic of the semiconductor circuit 210. For example, for the semiconductor circuit 210 being an amplifier, the characteristic of the semiconductor circuit 210 may be a gain or a Power-Added Effiency (PAE) of the amplifier. A future state, a future efficiency, or a future performance capability of the semiconductor circuit 210 may, e.g., be predicted on the basis of the waveform of the signal 214-1, 214-2 and the reliability model. The future state may, e.g., allow to predict a remaining life-time of the semiconductor circuit 210 or the transistor 211, or may indicate an imminent failure of the semiconductor circuit 210.

Generally speaking, the measuring unit 220 of the apparatus 200 measures a waveform of at least one signal at a node of the semiconductor circuit, and the processing unit 230 calculates a predicted value of a characteristic of the semiconductor circuit 210 using the waveform of the signal.

The apparatus 200 may allow to initiate preventive measures based on the predicted future state of the semiconductor circuit 210. For example, if the predicted future state indicates an imminent failure, the transistor 211 may be replaced or the tasks of the transistor 211 may be delegated to another transistor of the semiconductor circuit 210.

In order to determine adequate countermeasures, the processing unit 230 may in some examples compare the predicted value 233 of the characteristic of the semiconductor circuit 210 to a quality criterion. The quality criterion may, e.g., be a value or value range for the characteristic of the semiconductor circuit 210 expected by the manufacturer. That is, the predicted value may be compared to a desired or nominal value of the characteristic. For example, for the semiconductor circuit 210 being an amplifier, the processing unit 230 may compare a predicted gain or a predicted PAE of the amplifier to respective nominal values.

Based on the result of the comparison, the processing unit 230 may further adjust one or more operation parameters (tuning capabilities) 240 of the semiconductor circuit 210. In some examples, the processing unit 230 may adjust a supply voltage for the semiconductor circuit 210, an operating point of the semiconductor circuit 210, or a load impedance (for the semiconductor circuit 210 being a RF circuit) based on the result of the comparison. For example, if the predicted value of the signal characteristic is different from a desired value or value range of the signal characteristic, the processing unit 230 may increase or lower the supply voltage for the semiconductor circuit 210. For example, if the signal characteristic indicates that the life-time of the semiconductor circuit 210 is lower than a desired (nominal) life-time, lowering the supply voltage for the semiconductor circuit 210 may allow to extend the actual life-time of the electronic component 110 since a lower supply voltage may, e.g., cause a smaller amount of degradation of the transistor 211 (e.g. less HCD or TDDB for a transistor). Moreover, if the signal characteristic indicates that the life-time of the semiconductor circuit 210 is above the nominal life-time, increasing the supply voltage for the semiconductor circuit 210 may allow to increase a power (performance) of the semiconductor circuit 210 for the trade-off that the actual life-time of the semiconductor circuit 210 decreases to the nominal life-time. Hence, a user may experience an increased performance of an electronic device using the semiconductor circuit 210. Adapting the load impedance or the operating point of the semiconductor circuit 210 may allow to change transient waveforms of, e.g., the first and second signals 214-1, 214-2. Hence, the waveforms of the reliability critical transient signals may be manipulated to enhance the reliability of the semiconductor circuit 210.

In other words, the apparatus 200 may be understood as a reliability monitor that utilizes the fact that transistor degradation depends on the transient waveforms at the device terminals. For example, as an on-chip reliability monitor, the apparatus 200 may record reliability critical radio frequency (RF) and fast transient signals, predict the life-time of a circuit under present operating conditions, allow the adjustment of circuit operation parameters, and thus maximize the life-time of a circuit. The on-chip reliability monitor may thus comprise a fast-sampling on-chip oscilloscope, a prediction-of-life-time component on the basis of the sampled signal and physical reliability models, and a feedback control setting the operating parameters (e.g. $V_{dd}$) of the circuit according to desired operating conditions (e.g. maximum life-time, maximum performance, or balanced life-time/performance, . . . ).

The reliability monitor may record transient waveforms at selected notes in the circuit under test. Analytical reliability models may then, e.g., be used to extrapolate transistor parameter drifts (e.g. drift of threshold voltage $V_{th}$, transconductance gm, drain saturation current $I_{d\_sat}$, etc.) and the consequent decrease in circuit performance metrics at future points during product lifetime (e.g. after 1 month, 1 year, 5 years etc.). Based on this "degradation forecast", the control system may decide about corrective actions. If the forecast reveals that the target lifetime is not met, system parameters may be adapted in a way to obtain the target lifetime. Otherwise, unused safety margins may be used for additional circuit performance. The monitor may predict degradation at any time by recording and assessing actual signal waveforms. It may trigger corresponding counteractions before sufficient degradation becomes noticeable and recognize unused safety margins for the benefit of improved circuit performance.

For example, a major reliability concern for radio frequency circuits is oxide breakdown in transistors of the circuit, which causes a significant increase in the gate current. The monitor may forecast future degradation before the actual breakdown of transistor occurs. By monitoring transient waveforms, the remaining time to breakdown may be calculated in advance. The system may immediately trigger corrective actions to avoid the breakdown, so that the specified lifetime may be reached. Although the above example mainly focuses on degradation/breakdown monitoring in analog/RF circuits, the monitoring concept may be used in every circuit which shows reliability critical transients. Also, it is not restricted to degradation/breakdown monitoring, it may addresses further areas, e.g. noise characterization, trapping/de-trapping characterization, thermal transient transistor variations etc.

The apparatus 200 may comprise one or more additional optional features corresponding to one or more aspects of the proposed concept or one or more examples described below.

Figure 3:
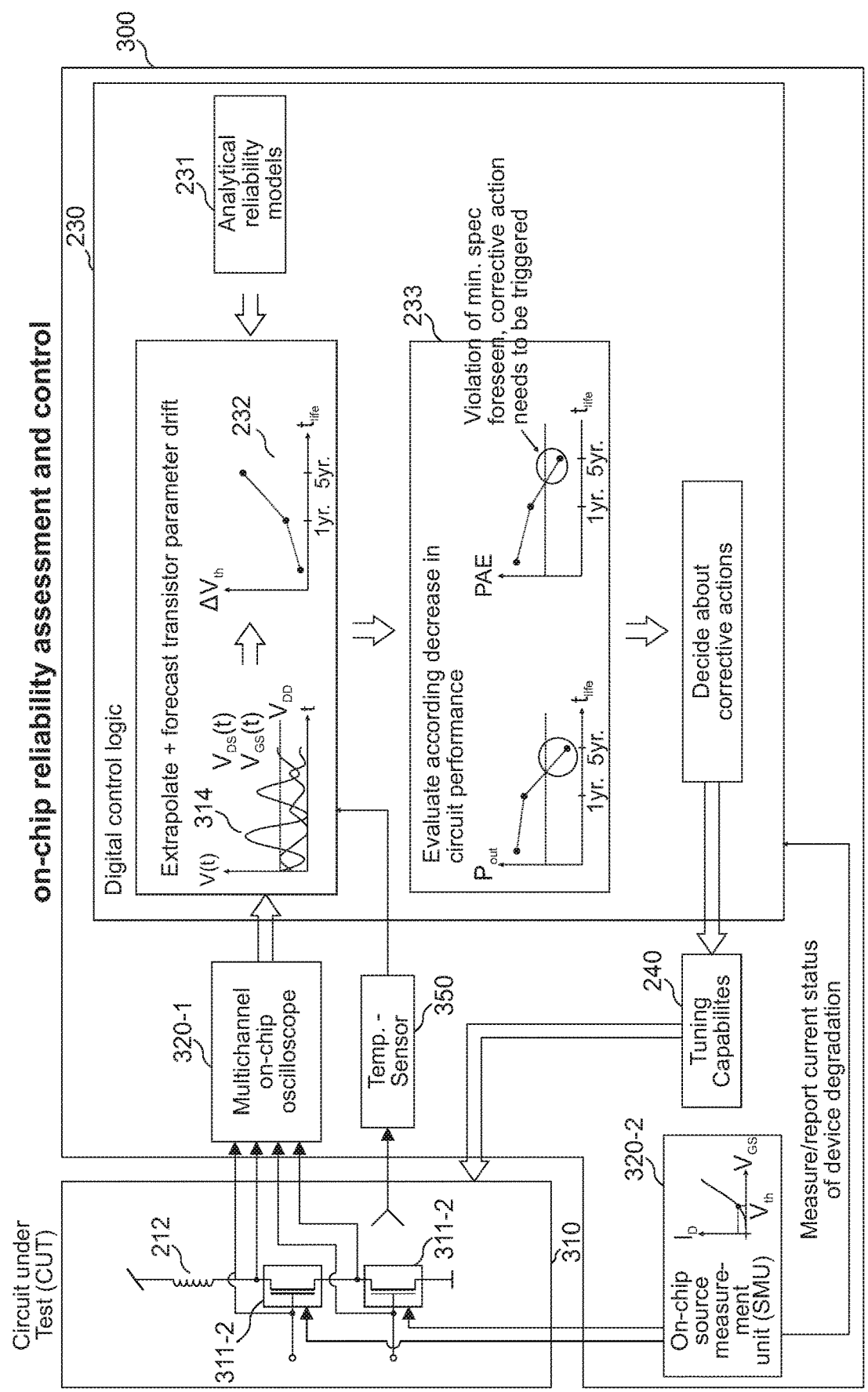
FIG. 3 illustrates another example of an apparatus for predicting a future state of a semiconductor circuit.

FIG. 3 illustrates another apparatus 300 for predicting a future state of a semiconductor circuit 310. The semiconductor circuit 310 comprises inter alia a first transistor 311-1 and a second transistor 311-2, a source of which is coupled to a drain of the first transistor 311-1. A coil 212 is coupled to a drain of the second transistor 311-2.

The structure of apparatus 300 is similar to that of apparatus 200 illustrated in FIG. 2. Accordingly, only differences or additional features of the apparatus 300 compared to the apparatus 200 are explained in the following description of FIG. 3.

In the apparatus 300 in FIG. 3, a first subunit 320-1 of the measurement unit measures waveforms of multiple signals of the semiconductor circuit 310. In particular, the first subunit 320-1 of the measurement unit measures signals at the gates and the drains of the first and second transistors 311-1 and 311-2, respectively. Using the measured waveforms 314, the processing unit 230 calculates a value 232 of a characteristic for at least one of the first and the second transistors 311-1 and 311-2. For example, the processing unit 230 may calculate a future divergence (drift) of the threshold voltage for the first transistor 311-1 and/or the second transistor 311-2. Additionally, the processing unit 230 may further use a temperature of the semiconductor circuit 310, or a temperature of at least one of the first and the second transistors 311-1 and 311-2. The temperature may be provided (and measured) by at least one temperature sensor 350. Additionally using the temperature may increase the prediction precision for the value of the characteristic (e.g. the threshold voltage of one of the transistors 311-1, 311-2).

Based on the predicted value(s) for characteristic, the processing unit 230 calculates a predicted value 233 of a characteristic of the semiconductor circuit 310. For example, for the semiconductor circuit 310 being an amplifier, the processing unit 230 may calculate a divergence of the amplifier's output power or the PAE.

Based on a comparison of the value 233 of the predicted characteristic of the semiconductor circuit 310 with a quality criterion (e.g. a nominal value or value range for the characteristic), operation parameters (tuning capabilities) 240 of the semiconductor circuit 310 may be adjusted.

In order to not fully rely on the prediction of the reliability model, a second subunit 320-2 of the measurement unit the apparatus 300 further measures an instantaneous value of the characteristic of the electronic component at a time instant. As illustrated, the first and the second subunits 320-1, 320-2 may be implemented as stand-alone units. For example, the first subunit 320-1 may be implemented as an on-chip oscilloscope on the semiconductor substrate holding the semiconductor circuit 310, whereas the second subunit 320-2 may be implemented as a Source Measurement Unit (SMU) which provides power to at least part of the semiconductor circuit 310 while measuring a voltage value or a current value of electrical signal provided to an element of the semiconductor circuit.

For example, the second subunit 320-2 of the measurement unit may measure (and optionally calculate) an instantaneous threshold voltage value for at least one of the first and the second transistors 311-1, 311-2. The processing unit 230 compares the instantaneous value of the characteristic of the electronic component to the predicted value of the characteristic of the electronic component calculated for the time instant. For example, the instantaneously measured threshold voltage of the first transistor 311-1 may be compared to the value of the threshold voltage predicted for the time instant of the measurement. The comparison may allow a verification of the predicted value and hence a verification of the used reliability model. For example, if the measured value of the threshold voltage of the first transistor 311-1 differs from the predicted value, one or more coefficients, mathematical terms etc. of the reliability model may be adapted based on the comparison result. Accordingly, the reliability model may be adapted to the actual behavior of the first transistor 311-1 (as an example for an electronic component of the semiconductor circuit 310). Additionally or alternatively, the operation parameters 240 of the semiconductor circuit 310 may be adjusted based on the comparison. Hence, an improved operation (reliability) of the semiconductor circuit 310 may be achieved since improper operation parameters 240, which are related to the underestimation or overestimation of the characteristic of the electronic component of the semiconductor circuit 310 by the reliability model, may be adjusted (corrected).

The instantaneous value of the characteristic of the electronic component (as provided by the second subunit 320-2) may further be compared to the quality criterion. Hence, an instantaneous state of the semiconductor circuit 310 or the electronic component may be determined. Based on the comparison result, the reliability model may be adjusted in order to more precisely model the actual behavior of the electronic component. Additionally or alternatively, the operation parameters 240 of the semiconductor circuit 310 may be adjusted based on the comparison in order to adapt the operation of the semiconductor circuit 310 to the actual state.

The apparatus 300 (and also the apparatus 200) may operate only in response to a trigger event. For example, a trigger event may be an occurrence of a pre-determined time instant. Hence, the future state of the semiconductor circuit 310 may be determined in, e.g., regular time intervals, so that countermeasures may be initiated at an early stage if necessary. A trigger event may also be an event where a voltage value of a measured signal of the semiconductor circuit 310 is above a threshold value. A high voltage of such a signal may indicate the presence of a reliability critical transient signal. Furthermore, the presence of a reliability critical transient signal may be indicated by an event where a mode of operation of the semiconductor circuit 310 changes, so that also a change of a mode of operation of the semiconductor circuit 310 may trigger an operation of the apparatus 300. By operating the apparatus 300 merely in response to potentially harmful trigger events, a power consumption of the apparatus 300 may be low. Additionally, efficient prediction of future states of the semiconductor circuit 310 may be assured since the apparatus is active in response to the potentially harmful trigger events.

In other words, a block diagram and a flow chart of a monitor system may be illustrated in FIG. 3. Transistor degradation may mainly be influenced by two factors: a) transient voltage waveforms at device terminals (e.g. gate source voltage $V_{GS}(t)$, drain source voltage $V_{DS}(t)$) and b) temperature. If both is known, future degradation may be precisely predicted by physics based, analytical reliability models. The monitor system may thus record transient waveforms at critical transistors in a Circuit Under Test (CUT) by a multichannel on-chip oscilloscope (OCO). The OCO may provide the waveform data in digitized form to the control logic. Information about the local temperature in the CUT may be delivered by a temperature sensor. Both information may be used by the logic to extrapolate and forecast transistor parameter drift (e.g. $\Delta V_{th}$, $\Delta I_{d\_sat}$, time to breakdown) at future times. A control logic may calculate a parameter drift dependent decrease in important circuit performance metrics (e.g. maximum output power, amplifier gain, power added efficiency, etc.). Based on this outcome, the monitor system may decide about corrective actions.

If the "reliability forecast" reveals that the target lifetime will not be met as performance metrics will fall out of specifications (see FIG. 3), the system may immediately trigger corrective actions to meet the target lifetime. These kind of corrective actions may for instance include a reduction of supply voltage $V_{DD}$ or in case of a radio frequency circuit a modification of the load impedance to influence the transient waveforms accordingly. In the reverse case, if the reliability assessment reveals that the intended circuit lifetime is probably exceeded, the monitor system may also approve unused safety margins. For instance, it could allow a higher supply voltage $V_{DD}$ to increase the maximum output power etc. In short, the monitor system may find optimum conditions for the CUT which guarantee both reliable circuit operation and maximum performance at the same time.

The lifetime and performance prediction may be repeated continuously. Therefore it may be advantageous to know also the current status of degradation. The current degradation status may be determined by a SMU. The SMU may characterize selected devices on chip, e.g. to determine the current value of $V_{th}$ or $I_{d\,sat}$. The integrated SMU may ensure that the monitor circuit does not fully rely on its forecasts.

The waveform profile of a transient signal may have a very strong influence on the circuit reliability in nanometer scale Complementary Metal-Oxide-Semiconductor (CMOS) processes. Although waveforms and the according influence on the circuit reliability can be assessed during product development, there is still a factor of uncertainty. For instance, for radio frequency signals, a small decrease of the maximum voltage levels of 10, 20, or 50 mV may cause a significant lifetime bonus of 40, 60, or 100%. Therefore, assessing and controlling transient waveforms may be a very efficient way to precisely monitor and control circuit reliability.

In order to reduce power consumption, the monitor may work most of the time in standby mode and may be active only at specific trigger events. Recording transients and degradation/breakdown prediction and/or device characterization may typically be triggered either at certain time points (e.g. at system startup, logarithmically during operation etc.) or after reliability critical events have occurred. Such events may be detected by the monitor system itself using special event monitors (e.g. peak detectors). In most applications (e.g. for DC-DC converters) it may be a priori known that reliability critical transients occur after a change of operation mode. In such cases the CUT can call signal monitoring or device characterization itself.

The apparatus 300 may comprise one or more additional optional features corresponding to one or more aspects of the proposed concept or one or more examples described below.

Generally speaking, some examples of the present disclosure relate to a means for predicting a future state of a semiconductor circuit. The means for predicting comprises a means for measuring a waveform of a signal at a node of the semiconductor circuit, wherein the signal is related to an electronic component of the semiconductor circuit. The means for predicting further comprises a means for calculating a predicted value of a characteristic of the electronic component based on a reliability model of the electronic component using the waveform of the signal. The means for calculating is further configured to calculate a predicted value of a characteristic of the semiconductor circuit based on the predicted value of the characteristic of the electronic component.

Some examples relate to a means for predicting a future state of a semiconductor circuit that comprises a means for measuring a waveform of a signal at a node of the semiconductor circuit, and a means for calculating a predicted value of a characteristic of the semiconductor circuit using the waveform of the signal.

In this respect, the means for calculating may further compare the predicted value of the characteristic of the semiconductor circuit to a quality criterion, and adjust an operation parameter of the semiconductor circuit based on the result of the comparison.

The means for predicting a future state of a semiconductor circuit may be implemented by an apparatus for predicting a future state of a semiconductor circuit described above or below (e.g. FIG. 2 or FIG. 3). The means for measuring a future state of an electronic component may be implemented by a measuring unit described above or below (e.g. FIG. 2 or FIG. 3). The means for calculating may be implemented by a processing unit described above or below (e.g. FIG. 2 or FIG. 3).

Figure 4:
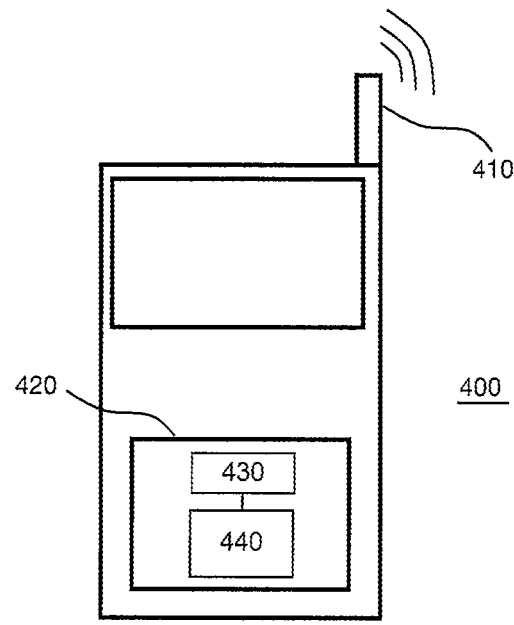
FIG. 4 illustrates an example of a mobile communications device comprising an apparatus for predicting a future state of an electronic component.

An example of an implementation using future state prediction for an electronic component according to one or more aspects of the proposed concept or one or more examples described above is illustrated in FIG. 4. FIG. 4 schematically illustrates an example of a mobile communications device or mobile phone or user equipment 400 comprising an apparatus 440 for predicting a future state of an electronic component 430 of the mobile communications device 400 according to an example described herein. The apparatus 440 and the electronic component 430 may be comprised on a semiconductor substrate 420. To this end, mobile communications devices may be provided having increased reliability and performance.

Figure 5:
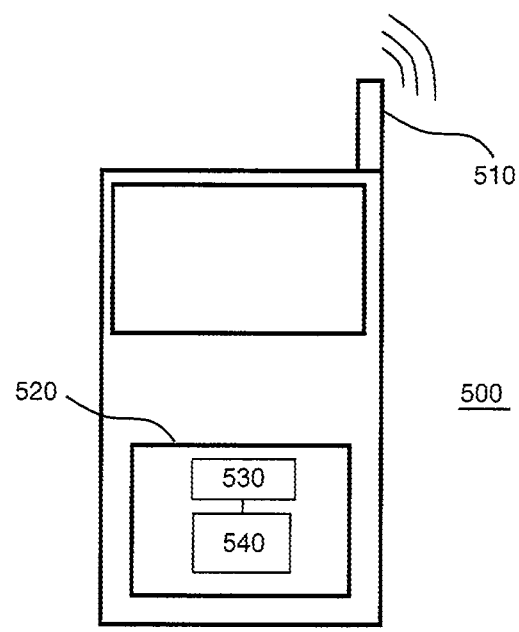
FIG. 5 illustrates an example of a mobile communications device comprising an apparatus for predicting a future state of a semiconductor circuit.

An example of an implementation using future state prediction for a semiconductor circuit according to one or more aspects of the proposed concept or one or more examples described above is illustrated in FIG. 5. FIG. 5 schematically illustrates an example of a mobile communications device or mobile phone or user equipment 500 comprising an apparatus 540 for predicting a future state of a semiconductor circuit 530 of the mobile communications device 500 according to an example described herein. The apparatus 540 and the semiconductor circuit 530 may be comprised on a semiconductor substrate 520. In some examples, the semiconductor circuit 530 may process a RF signal (e.g. receive, generate, or amplify). The RF signal may, e.g., be provided by or transmitted to an antenna element 510 of the mobile communications device 500. To this end, mobile communications devices may be provided having increased reliability and performance.

Figure 6:
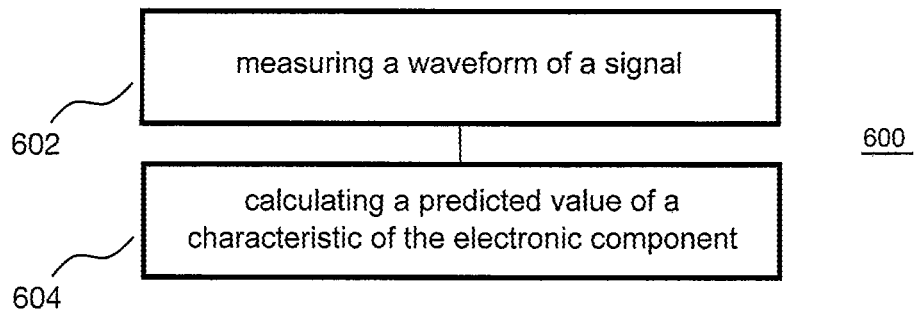
FIG. 6 illustrates a flowchart of an example of a method for predicting a future state of an electronic component.

An example of a method 600 for predicting a future state of an electronic component is illustrated by means of a flowchart in FIG. 6. The method comprises measuring 602 a waveform of a signal related to the electronic component. Further, the method comprises calculating 604 a predicted value of a characteristic of the electronic component based on a reliability model of the electronic component using the waveform of the signal.

More details and aspects of the method are mentioned in connection with the proposed concept or one or more examples described above (e.g. FIGS. 1-5). The method may comprise one or more additional optional features corresponding to one or more aspects of the proposed concept or one or more examples described above.

Figure 7:
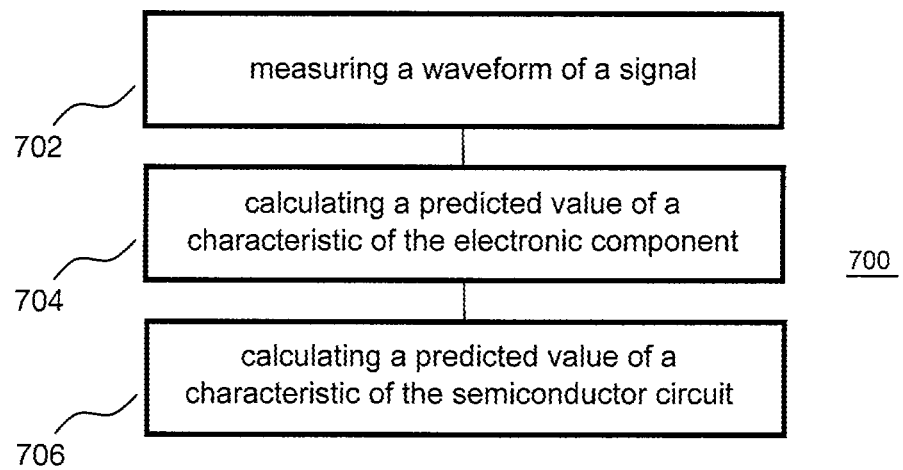
FIG. 7 illustrates a flowchart of an example of a method for predicting a future state of a semiconductor circuit.

An example of a method 700 for predicting a future state of a semiconductor circuit is illustrated by means of a flowchart in FIG. 7. The method comprises measuring 702 a waveform of a signal at a node of the semiconductor circuit. The signal is related to an electronic component of the semiconductor circuit. Further, the method comprises calculating 704 a predicted value of a characteristic of the electronic component based on a reliability model of the electronic component using the waveform of the signal. The method further comprises calculating 706 a predicted value of a characteristic of the semiconductor circuit based on the predicted value of the characteristic of the electronic component.

More details and aspects of the method are mentioned in connection with the proposed concept or one or more examples described above (e.g. FIGS. 1-5). The method may comprise one or more additional optional features corresponding to one or more aspects of the proposed concept or one or more examples described above.

Figure 8:
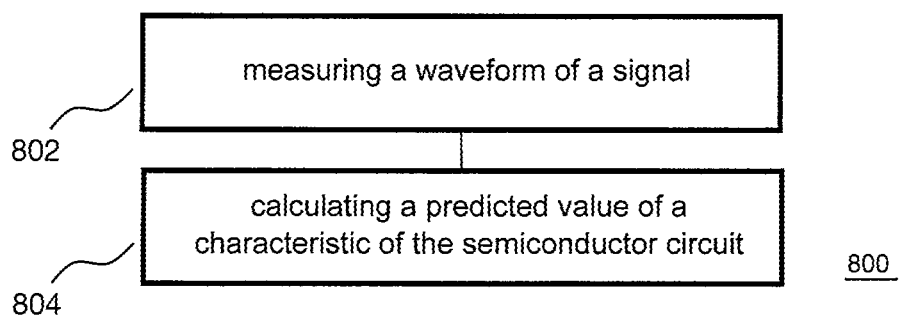
FIG. 8 illustrates a flowchart of another example of a method for predicting a future state of a semiconductor circuit.

Another example of a method 800 for predicting a future state of a semiconductor circuit is illustrated by means of a flowchart in FIG. 8. The method comprises measuring 802 a waveform of a signal at a node of the semiconductor circuit. Further, the method comprises calculating 804 a predicted value of a characteristic of the semiconductor circuit using the waveform of the signal.

More details and aspects of the method are mentioned in connection with the proposed concept or one or more examples described above (e.g. FIGS. 1-5). The method may comprise one or more additional optional features corresponding to one or more aspects of the proposed concept or one or more examples described above.

The examples as described herein may be summarized as follows:

Example 1 is a method for predicting a future state of an electronic component, comprising: measuring a waveform of a signal related to the electronic component; and calculating a predicted value of a characteristic of the electronic component based on a reliability model of the electronic component using the waveform of the signal.

In example 2, the method of example 1 further comprises: comparing the predicted value of the characteristic of the electronic component to a quality criterion; and adjusting an operation parameter of the electronic component based on a result of the comparison.

In example 3, adjusting an operation parameter of the electronic component in the method of example 2 comprises adjusting a supply voltage for the electronic component based on the result of the comparison.

In example 4, calculating the predicted value of the characteristic of the electronic component in the method of any of the preceding examples is further based on a temperature of the electronic component.

In example 5, the method of any of the preceding examples further comprises: measuring an instantaneous value of the characteristic of the electronic component at a time instant; and comparing the instantaneous value of the characteristic of the electronic component to the predicted value of the characteristic of the electronic component calculated for the time instant or the quality criterion.

In example 6, the method of example 5 further comprises adjusting the operation parameter of the electronic component based on the comparison between the instantaneous value of characteristic of the electronic component and the predicted value of the characteristic of the electronic component calculated for the time instant or the quality criterion.

In example 7, the method of example 5 or example 6 further comprises adjusting the reliability model based on the comparison between the instantaneous value of characteristic of the electronic component and the predicted value of the characteristic of the electronic component calculated for the time instant or the quality criterion.

In example 8, the electronic component is a transistor in the method of any of the preceding examples.

In example 9, the signal represents a voltage at a terminal of the transistor, a voltage between terminals of the transistor, or a current at a terminal of the transistor in the method of example 8.

In example 10, the characteristic of the electronic component in the method of example 8 or example 9 is a threshold voltage of the transistor, a drain saturation current of the transistor, a transconductance of the transistor, a gate leakage current of the transistor, a bulk current of the transistor, a current gain of the transistor, a differential input resistance of the transistor, a differential output resistance of the transistor, or a maximum collector current of the transistor.

In example 11, the signal is a transient signal in the method of any of the preceding examples.

In example 12, the method of any of the preceding examples is only performed in response to a trigger event.

In example 13, the trigger event in the method of example 12 is an occurrence of a predetermined time instant, or an event where a voltage value of the signal is above a threshold value.

Example 14 is a method for predicting a future state of a semiconductor circuit, comprising: measuring a waveform of a signal at a node of the semiconductor circuit, the signal being related to an electronic component of the semiconductor circuit; calculating a predicted value of a characteristic of the electronic component based on a reliability model of the electronic component using the waveform of the signal; and calculating a predicted value of a characteristic of the semiconductor circuit based on the predicted value of the characteristic of the electronic component.

In example 15, the method of example 14 further comprises: comparing the predicted value of the characteristic of the semiconductor circuit to a quality criterion; and adjusting an operation parameter of the semiconductor circuit based on a result of the comparison.

In example 16, adjusting an operation parameter of the semiconductor circuit in the method of example 15 comprises adjusting a supply voltage for the semiconductor circuit based on the result of the comparison.

In example 17, calculating the predicted value of the characteristic of the electronic component in the method of any of examples 14 to 16 is further based on a temperature of the semiconductor circuit.

In example 18, the method of any of examples 14 to 17 further comprises: measuring an instantaneous value of the characteristic of the electronic component at a time instant; and comparing the instantaneous value of the characteristic of the electronic component to the predicted value of the characteristic of the electronic component calculated for the time instant or the quality criterion.

In example 19, the method of example 18 further comprises adjusting the operation parameter of the semiconductor circuit based on the comparison between the instantaneous value of characteristic of the electronic component and the predicted value of the characteristic of the electronic component calculated for the time instant or the quality criterion.

In example 20, the method of example 18 or example 19 further comprises adjusting the reliability model based on the comparison between the instantaneous value of characteristic of the electronic component and the predicted value of the characteristic of the electronic component calculated for the time instant or the quality criterion.

In example 21, the electronic component is a transistor in the method of any of examples 14 to 20.

In example 22, the signal represents a voltage at a terminal of the transistor, a voltage between terminals of the transistor, or a current at a terminal of the transistor in the method of example 21.

In example 23, the characteristic of the electronic component in the method of example 21 or example 22 is a threshold voltage of the transistor, a drain saturation current of the transistor, a transconductance of the transistor, a gate leakage current of the transistor, a bulk current of the transistor, a current gain of the transistor, a differential input resistance of the transistor, a differential output resistance of the transistor, or a maximum collector current of the transistor.

In example 24, the signal is a transient signal in the method of any of examples 14 to 23.

In example 25, the method of any of examples 14 to 24 is only performed in response to a trigger event.

In example 26, the trigger event in the method of example 25 is an occurrence of a predetermined time instant, an event where a voltage value of the signal is above a threshold value, or an event where a mode of operation of the semiconductor circuit changes.

Example 27 is a method for predicting a future state of a semiconductor circuit, comprising:
measuring a waveform of a signal at a node of the semiconductor circuit; and calculating a predicted value of a characteristic of the semiconductor circuit using the waveform of the signal.

In example 28, the method of example 27 further comprises: comparing the predicted value of the characteristic of the semiconductor circuit to a quality criterion; and adjusting an operation parameter of the semiconductor circuit based on a result of the comparison.

In example 29, calculating the predicted value of the characteristic of the electronic component in the method of example 27 or example 28 is further based on a temperature of the semiconductor circuit.

Example 30 is a computer readable storage medium having stored thereon a program having a program code for performing the method of any of examples 1 to 29, when the program is executed on a computer or processor.

Example 31 is a computer program having a program code configured to perform the method of any of examples 1 to 29, when the computer program is executed on a computer or processor.

Example 32 is an apparatus for predicting a future state of an electronic component, comprising: a measuring unit configured to measure a waveform of a signal related to the electronic component; and a processing unit configured to calculate a predicted value of a characteristic of the electronic component based on a reliability model of the electronic component using the waveform of the signal.

In example 33, the processing unit of the apparatus of example 32 is further configured to: compare the predicted value of the characteristic of the electronic component to a quality criterion; and adjust an operation parameter of the electronic component based on a result of the comparison.

In example 34, the processing unit of the apparatus of example 33 is configured to adjust a supply voltage for the electronic component based on the result of the comparison.

In example 35, the processing unit of the apparatus of any of the preceding examples is further configured to calculate the predicted value of the characteristic of the electronic component based on a temperature of the electronic component.

In example 36, the measuring unit of the apparatus of any of the preceding examples is further configured to measure an instantaneous value of the characteristic of the electronic component at a time instant, and the processing unit is further configured to compare the instantaneous value of the characteristic of the electronic component to the predicted value of the characteristic of the electronic component calculated for the time instant or the quality criterion.

In example 37, the processing unit of the apparatus of example 36 is further configured to adjust the operation parameter of the electronic component based on the comparison between the instantaneous value of characteristic of the electronic component and the predicted value of the characteristic of the electronic component calculated for the time instant or the quality criterion.

In example 38, the processing unit of the apparatus of example 36 or example 37 is further configured to adjust the reliability model based on the comparison between the instantaneous value of characteristic of the electronic component and the predicted value of the characteristic of the electronic component calculated for the time instant or the quality criterion.

In example 39, the electronic component of the apparatus of any of the preceding examples is a transistor.

In example 40, the signal represents one of a voltage at a terminal of the transistor, a voltage between terminals of the transistor, and a current at a terminal of the transistor in the apparatus of example 39.

In example 41, the characteristic of the electronic component of the apparatus of example 39 or example 40 is a threshold voltage of the transistor, a drain saturation current of the transistor, a transconductance of the transistor, a gate leakage current of the transistor, a bulk current of the transistor, a current gain of the transistor, a differential input resistance of the transistor, a differential output resistance of the transistor, or a maximum collector current of the transistor.

In example 42, the signal is a transient signal in the apparatus of any of the preceding examples.

In example 43, the measuring unit and the processing unit of the apparatus of any of the preceding examples are further configured to operate only in response to a trigger event.

In example 44, the trigger event for the apparatus of example 43 is an occurrence of a predetermined time instant, or an event where a voltage value of the signal is above a threshold value.

Example 45 is an apparatus for predicting a future state of a semiconductor circuit, comprising: a measuring unit configured to measure a waveform of a signal at a node of the semiconductor circuit, the signal being related to an electronic component of the semiconductor circuit; and a processing unit configured to calculate a predicted value of a characteristic of the electronic component based on a reliability model of the electronic component using the waveform of the signal, wherein the processing unit is further configured to calculate a predicted value of a characteristic of the semiconductor circuit based on the predicted value of the characteristic of the electronic component.

In example 46, the processing unit of the apparatus of example 45 is further configured to: compare the predicted value of the characteristic of the semiconductor circuit to a quality criterion; and adjust an operation parameter of the semiconductor circuit based on a result of the comparison.

In example 47, the processing unit of the apparatus of example 46 is configured to adjust a supply voltage for the semiconductor circuit based on the result of the comparison.

In example 48, the processing unit of the apparatus of any of examples 45 to 47 is further configured to calculate the predicted value of the characteristic of the electronic component based on a temperature of the semiconductor circuit.

In example 49, the measuring unit of the apparatus of any of examples 45 to 48 is further configured to measure an instantaneous value of the characteristic of the electronic component at a time instant, and the processing unit is further configured to compare the instantaneous value of the characteristic of the electronic component to the predicted value of the characteristic of the electronic component calculated for the time instant or the quality criterion.

In example 50, the processing unit of the apparatus of example 49 is further configured to adjust the operation parameter of the semiconductor circuit based on the comparison between the instantaneous value of characteristic of the electronic component and the predicted value of the characteristic of the electronic component calculated for the time instant or the quality criterion.

In example 51, the processing unit of the apparatus of example 49 or example 50 is further configured to adjust the reliability model based on the comparison between the instantaneous value of characteristic of the electronic component and the predicted value of the characteristic of the electronic component calculated for the time instant or the quality criterion.

In example 52, the electronic component of the apparatus of any of examples 45 to 51 is a transistor.

In example 53, the signal represents a voltage at a terminal of the transistor, a voltage between terminals of the transistor, or a current at a terminal of the transistor in the apparatus of examples 52.

In example 54, the characteristic of the electronic component of the apparatus of example 52 or example 53 is a threshold voltage of the transistor, a drain saturation current of the transistor, a transconductance of the transistor, a gate leakage current of the transistor, a bulk current of the transistor, a current gain of the transistor, a differential input resistance of the transistor, a differential output resistance of the transistor, or a maximum collector current of the transistor.

In example 55, the signal is a transient signal in the apparatus of any of examples 45 to 54.

In example 56, the measuring unit and the processing unit of the apparatus of any of examples 45 to 55 are further configured to operate only in response to a trigger event.

In example 57, the trigger event for the apparatus of example 56 is an occurrence of a predetermined time instant, an event where a voltage value of the signal is above a threshold value, or an event where a mode of operation of the semiconductor circuit changes.

Example 58 is an apparatus for predicting a future state of a semiconductor circuit comprising: a measuring unit configured to measure a waveform of a signal at a node of the semiconductor circuit; and a processing unit configured to calculate a predicted value of a characteristic of the semiconductor circuit using the waveform of the signal.

In example 59, the processing unit of the apparatus of example 58 is further configured to: compare the predicted value of the characteristic of the semiconductor circuit to a quality criterion; and adjust an operation parameter (240) of the semiconductor circuit (210, 310) based on a result of the comparison.

In example 60, the processing unit of the apparatus of example 58 or example 59 is further configured to calculate the predicted value of the characteristic of the electronic component based on a temperature of the semiconductor circuit.

Example 61 is a semiconductor substrate comprising an electronic component and an apparatus for predicting a future state of the electronic component according to any of examples 32 to 44.

Example 62 is a semiconductor substrate comprising a semiconductor circuit and an apparatus for predicting a future state of the semiconductor circuit according to any of examples 45 to 57 or an apparatus for predicting a future state of the semiconductor circuit according to any of examples 57 to 60.

In example 63, the semiconductor circuit (530) of the semiconductor substrate of example 62 is configured to process a radio frequency signal.

Example 64 is a mobile communications device comprising a semiconductor substrate according to example 61 or a semiconductor substrate according to example 62 or example 63.

Example 65 is a means for predicting a future state of an electronic component, comprising: a means for measuring a waveform of a signal related to the electronic component; and a means for calculating a predicted value of a characteristic of the electronic component based on a reliability model of the electronic component using the waveform of the signal.

In example 66, the means for calculating of the means of example 65 is further configured to: compare the predicted value of the characteristic of the electronic component to a quality criterion; and adjust an operation parameter of the electronic component based on a result of the comparison.

Example 67 is a means for predicting a future state of a semiconductor circuit, comprising: a means for measuring a waveform of a signal at a node of the semiconductor circuit, the signal being related to an electronic component of the semiconductor circuit; and a means for calculating a predicted value of a characteristic of the electronic component based on a reliability model of the electronic component using the waveform of the signal, wherein the means for calculating is further configured to calculate a predicted value of a characteristic of the semiconductor circuit based on the predicted value of the characteristic of the electronic component.

In example 68, the means for calculating of the means of example 67 is further configured to: compare the predicted value of the characteristic of the semiconductor circuit to a quality criterion; and adjust an operation parameter of the semiconductor circuit based on a result of the comparison.

Example 69 is a means for predicting a future state of a semiconductor circuit, comprising: a means for measuring a waveform of a signal at a node of the semiconductor circuit; and a means for calculating a predicted value of a characteristic of the semiconductor circuit using the waveform of the signal.

In example 70, the means for calculating of the means of example 69 is further configured to: compare the predicted value of the characteristic of the semiconductor circuit to a quality criterion; and adjust an operation parameter of the semiconductor circuit based on a result of the comparison.

Examples may further provide a computer program having a program code for performing one of the above methods, when the computer program is executed on a computer or processor. A person of skill in the art would readily recognize that steps of various above-described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

What is claimed is:

1. A method for predicting a future state of an electronic component, comprising:
    measuring a waveform of a signal related to the electronic component;
    calculating a predicted value of a characteristic of the electronic component based on a reliability model of the electronic component using the waveform of the signal,
    measuring an instantaneous value of the characteristic of the electronic component at a time instant;
    comparing the instantaneous value of the characteristic of the electronic component to the predicted value of the characteristic of the electronic component calculated for the time instant or a quality criterion; and
    adjusting the reliability model based on the comparison between the instantaneous value of characteristic of the electronic component and the predicted value of the characteristic of the electronic component calculated for the time instant or the quality criterion.

2. The method of claim 1, wherein the method further comprises:
    comparing the predicted value of the characteristic of the electronic component to the quality criterion; and
    adjusting an operation parameter of the electronic component based on a result of the comparison.

3. The method of claim 1, wherein calculating the predicted value of the characteristic of the electronic component is further based on a temperature of the electronic component.

4. The method of claim 1, wherein the method further comprises adjusting the operation parameter of the electronic component based on the comparison between the instantaneous value of characteristic of the electronic component and the predicted value of the characteristic of the electronic component calculated for the time instant or the quality criterion.

5. The method of claim 1, wherein the electronic component is a transistor.

6. The method of claim 1, wherein the method is only performed in response to a trigger event.

7. A method for predicting a future state of a semiconductor circuit, comprising:
    measuring a waveform of a signal at a node of the semiconductor circuit, the signal being related to an electronic component of the semiconductor circuit;
    calculating a predicted value of a characteristic of the electronic component based on a reliability model of the electronic component using the waveform of the signal;

calculating a predicted value of a characteristic of the semiconductor circuit based on the predicted value of the characteristic of the electronic component, measuring an instantaneous value of the characteristic of the electronic component at a time instant; and comparing the instantaneous value of the characteristic of the electronic component to the predicted value of the characteristic of the electronic component calculated for the time instant or a quality criterion; and adjusting the reliability model based on the comparison between the instantaneous value of characteristic of the electronic component and the predicted value of the characteristic of the electronic component calculated for the time instant or the quality criterion.

8. The method of claim 7, wherein the method further comprises:

comparing the predicted value of the characteristic of the semiconductor circuit to the quality criterion; and adjusting an operation parameter of the semiconductor circuit based on a result of the comparison.

9. The method of claim 7, wherein calculating the predicted value of the characteristic of the electronic component is further based on a temperature of the semiconductor circuit.

10. The method of claim 7, wherein the method further comprises adjusting the operation parameter of the semiconductor circuit based on the comparison between the instantaneous value of characteristic of the electronic component and the predicted value of the characteristic of the electronic component calculated for the time instant or the quality criterion.

11. The method of claim 7, wherein the electronic component is a transistor.

12. An apparatus for predicting a future state of an electronic component, comprising:

a measuring unit configured to measure a waveform of a signal related to the electronic component; and a processing unit configured to calculate a predicted value of a characteristic of the electronic component based on a reliability model of the electronic component using the waveform of the signal, wherein the measuring unit is further configured to measure an instantaneous value of the characteristic of the electronic component at a time instant, wherein the processing unit is further configured to compare the instantaneous value of the characteristic of the electronic component to the predicted value of the characteristic of the electronic component calculated for the time instant or a quality criterion, and adjust the reliability model based on the comparison between the instantaneous value of characteristic of the electronic component and the predicted value of the characteristic of the electronic component calculated for the time instant or the quality criterion.

13. The apparatus of claim 12, wherein the processing unit is further configured to:

compare the predicted value of the characteristic of the electronic component to the quality criterion; and adjust an operation parameter of the electronic component based on a result of the comparison.

14. The apparatus of claim 12, wherein the processing unit is further configured to calculate the predicted value of the characteristic of the electronic component based on a temperature of the electronic component.

15. The apparatus of claim 12, wherein the processing unit is further configured to adjust the operation parameter of the electronic component based on the comparison between the instantaneous value of characteristic of the electronic component and the predicted value of the characteristic of the electronic component calculated for the time instant or the quality criterion.

16. An apparatus for predicting a future state of a semiconductor circuit, comprising:

a measuring unit configured to measure a waveform of a signal at a node of the semiconductor circuit, the signal being related to an electronic component of the semiconductor circuit; and a processing unit configured to calculate a predicted value of a characteristic of the electronic component based on a reliability model of the electronic component using the waveform of the signal, wherein the processing unit is further configured to calculate a predicted value of a characteristic of the semiconductor circuit based on the predicted value of the characteristic of the electronic component, wherein the measuring unit is further configured to measure an instantaneous value of the characteristic of the electronic component at a time instant, wherein the processing unit is further configured to compare the instantaneous value of the characteristic of the electronic component to the predicted value of the characteristic of the electronic component calculated for the time instant or a quality criterion, and adjust the reliability model based on the comparison between the instantaneous value of characteristic of the electronic component and the predicted value of the characteristic of the electronic component calculated for the time instant or the quality criterion.

17. The apparatus of claim 16, wherein the processing unit is further configured to:

compare the predicted value of the characteristic of the semiconductor circuit to a quality criterion; and adjust an operation parameter of the semiconductor circuit based on a result of the comparison.

18. The apparatus of claim 16, wherein the processing unit is further configured to adjust the operation parameter of the semiconductor circuit based on the comparison between the instantaneous value of characteristic of the electronic component and the predicted value of the characteristic of the electronic component calculated for the time instant or the quality criterion.

* * * * *